United States Patent
Dodd et al.

(10) Patent No.: US 9,561,657 B2
(45) Date of Patent: *Feb. 7, 2017

(54) MICROFLUIDIC DELIVERY MEMBER WITH FILTER AND METHOD OF FORMING SAME

(71) Applicants: STMicroelectronics, Inc., Coppell, TX (US); STMicroelectronics S.r.l., Agrate Brianza (IT); STMicroelectronics Asia Pacific Pte Ltd, Singapore (SG)

(72) Inventors: Simon Dodd, West Linn, OR (US); Joe Scheffelin, San Diego, CA (US); Dana Gruenbacher, Fairfield, OH (US); Roberto Brioschi, Sesto San Giovanni (IT); Teck Khim Neo, Singapore (SG); Dave Hunt, San Diego, CA (US); Faiz Sherman, Mason, OH (US)

(73) Assignees: STMicroelectronics S.r.l., Agrate Brianza (IT); STMicroelectronics Asia Pacific Pte Ltd, Singapore (SG); STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/138,997

(22) Filed: Apr. 26, 2016

(65) Prior Publication Data

US 2016/0236471 A1 Aug. 18, 2016

Related U.S. Application Data

(60) Continuation of application No. 14/981,056, filed on Dec. 28, 2015, now Pat. No. 9,357,635, which is a
(Continued)

(51) Int. Cl.
*B41J 2/14* (2006.01)
*B41J 2/175* (2006.01)
(Continued)

(52) U.S. Cl.
CPC ............... *B41J 2/1623* (2013.01); *B05B 1/14* (2013.01); *B05B 11/0054* (2013.01);
(Continued)

(58) Field of Classification Search
CPC ............. B41J 2202/11; B41J 2002/14491; B41J 2002/14459; B41J 2/1404; B41J 2/14056; B41J 2/14112; H05K 1/0272; H05K 3/305; H05K 1/09
(Continued)

(56) References Cited

U.S. PATENT DOCUMENTS 6,084,618 A 7/2000 Baker
6,548,895 B1 4/2003 Benavides et al.
(Continued)

FOREIGN PATENT DOCUMENTS

CN 101341028 A 1/2009
CN 103240986 A 8/2013
CN 204820669 U 12/2015

*Primary Examiner* — An Do
(74) *Attorney, Agent, or Firm* — Seed Intellectual Property Law Group LLP

(57) ABSTRACT

Embodiments are directed to microfluidic refill cartridges and methods of assembling same. The microfluidic refill cartridges include a microfluidic delivery member that includes a filter for filtering fluid passed therethrough. The filter may be configured to block particles above a threshold size to prevent blockage in the nozzles. For instance, particles having a dimension that is larger than the diameter of the nozzles can block or reduce fluid flow through the nozzle.

22 Claims, 15 Drawing Sheets

Related U.S. Application Data division of application No. 14/310,986, filed on Jun. 20, 2014, now Pat. No. 9,259,754.

(51) Int. Cl.

| | |
|---|---|
| *B41J 2/16* | (2006.01) |
| *B05B 15/00* | (2006.01) |
| *B05B 1/14* | (2006.01) |
| *H01L 23/00* | (2006.01) |
| *H05K 3/30* | (2006.01) |
| *H01L 41/113* | (2006.01) |
| *H05K 1/02* | (2006.01) |
| *H05K 1/09* | (2006.01) |
| *B05B 11/00* | (2006.01) |
| *H05K 1/18* | (2006.01) |

(52) U.S. Cl.
CPC ......... *B05B 15/008* (2013.01); *B41J 2/14024* (2013.01); *B41J 2/1433* (2013.01); *B41J 2/14145* (2013.01); *B41J 2/162* (2013.01); *H01L 24/27* (2013.01); *H01L 24/32* (2013.01); *H01L 24/83* (2013.01); *H01L 24/97* (2013.01); *H01L 41/1132* (2013.01); *H05K 1/0272* (2013.01); *H05K 1/09* (2013.01); *H05K 3/305* (2013.01); *H01L 24/29* (2013.01); *H01L 24/48* (2013.01); *H01L 24/85* (2013.01); *H01L 2224/2732* (2013.01); *H01L 2224/29011* (2013.01); *H01L 2224/29013* (2013.01); *H01L 2224/2919* (2013.01); *H01L 2224/32225* (2013.01); *H01L 2224/48096* (2013.01); *H01L 2224/48097* (2013.01); *H01L 2224/48106* (2013.01); *H01L 2224/48227* (2013.01); *H01L 2224/73265* (2013.01); *H01L 2224/838* (2013.01); *H01L 2224/83192* (2013.01); *H01L 2224/83862* (2013.01); *H01L 2224/83874* (2013.01); *H01L 2224/92247* (2013.01); *H01L 2224/97* (2013.01); *H01L 2924/00014* (2013.01); *H01L 2924/19106* (2013.01); *H05K 1/181* (2013.01); *H05K 2201/10083* (2013.01); *H05K 2201/10515* (2013.01); *H05K 2201/10545* (2013.01); *Y10T 156/1089* (2015.01)

(58) Field of Classification Search
USPC ... 347/44, 45, 47, 57–59, 62, 63, 65, 84–86, 347/93
See application file for complete search history.

(56) References Cited

U.S. PATENT DOCUMENTS

| | | | |
|---|---|---|---|
| 7,004,198 | B1 | 2/2006 | Okandan et al. |
| 7,422,911 | B2 * | 9/2008 | Schembri ............ B01J 19/0046 435/287.2 |
| 7,784,914 | B2 | 8/2010 | Dodd et al. |
| 8,899,727 | B2 | 12/2014 | Owaki et al. |
| 2002/0005878 | A1 | 1/2002 | Moon et al. |
| 2004/0087008 | A1 | 5/2004 | Schembri |
| 2007/0126773 | A1 | 6/2007 | Anderson et al. |
| 2007/0139475 | A1 | 6/2007 | King et al. |
| 2008/0309730 | A1 | 12/2008 | Sato et al. |
| 2008/0316274 | A1 | 12/2008 | Kondo |
| 2009/0212407 | A1 | 8/2009 | Foster et al. |
| 2011/0122194 | A1 | 5/2011 | Anderson et al. |
| 2011/0292124 | A1 | 12/2011 | Anderson et al. |

\* cited by examiner

US 9,561,657 B2

MICROFLUIDIC DELIVERY MEMBER WITH FILTER AND METHOD OF FORMING SAME

BACKGROUND

Technical Field

Embodiments are directed to microfluidic refillable cartridges that include a microfluidic delivery member and methods of making and using the same.

Description of the Related Art

Fluid delivery systems that include refill cartridges are currently being used in the printer industry. Many printers, including 3D printers, use replaceable inkjet cartridges that incorporate an ink reservoir and a print head for delivering ink from the reservoir to the paper. The print head includes nozzles with very small openings. Particles in the cartridges, such as contaminants in the fluid, can block the nozzles, preventing the cartridge from operating properly.

BRIEF SUMMARY

Embodiments are directed to microfluidic refill cartridges and methods of assembling same. The microfluidic refill cartridges include a microfluidic delivery member that includes a filter for filtering fluid passed therethrough. The filter may be configured to block particles above a threshold size to prevent blockage in the nozzles. For instance, particles having a dimension that is larger than the diameter of the nozzles can block or reduce fluid flow through the nozzle.

Additionally, it was realized that during assembly of the microfluidic refill cartridges contaminants other than those found in the fluid can also block the nozzle. For instance, contaminants during the assembly process can block one or more nozzles or fluid paths to the nozzles. Therefore, even if a filter is assembled into the microfluidic refill cartridge, some particles may already be downstream from the filter. In that regard, when the microfluidic delivery member is operated, the contaminants that are downstream from the filter and have a dimension that is greater than the diameter of the nozzle, may block the nozzle and thus prevent the nozzle from operating properly.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
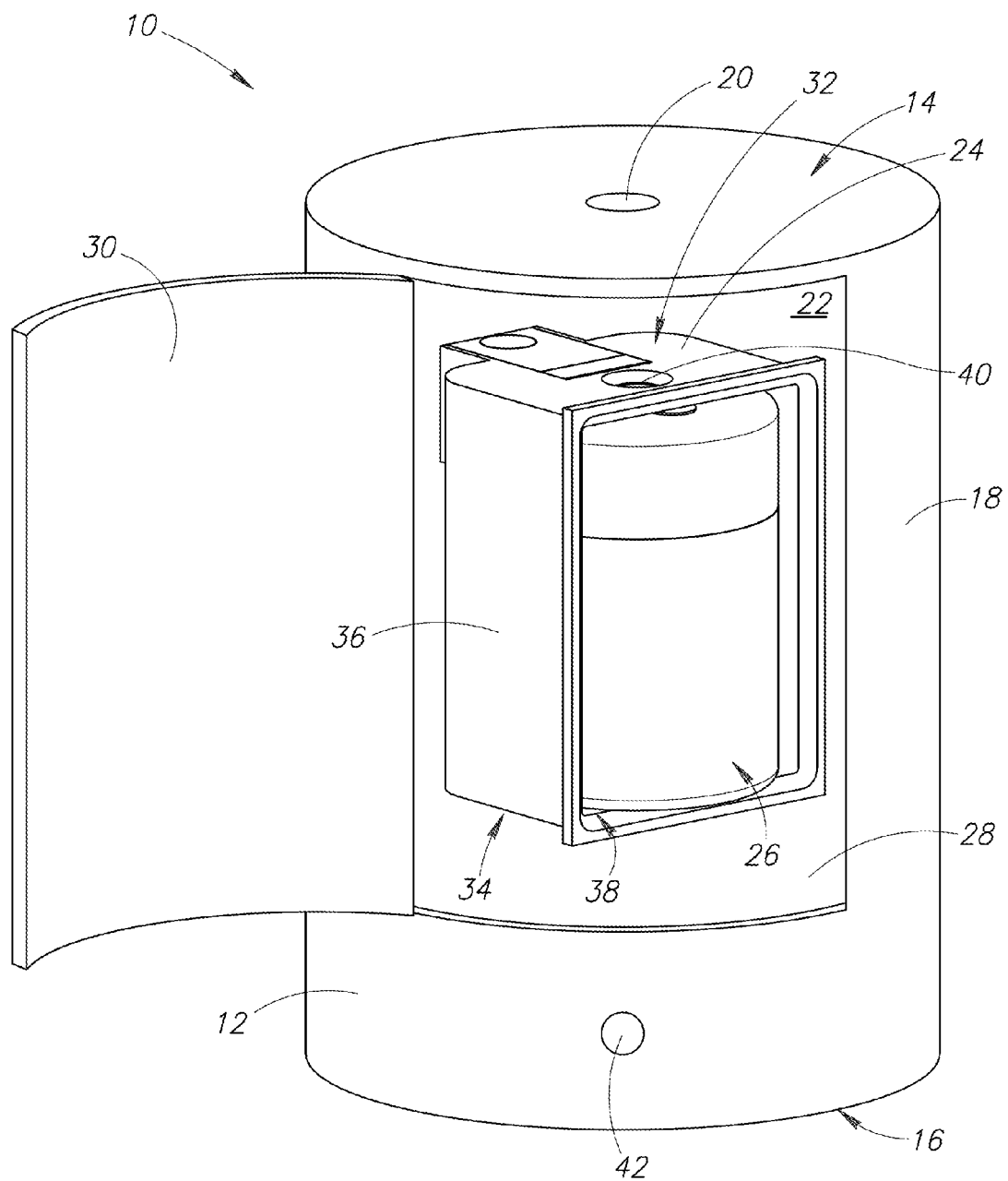
FIG. 1 is a schematic isometric view of a microfluidic delivery system in accordance with one embodiment.

FIG. 1 illustrates a microfluidic delivery system 10 in accordance with one embodiment of the disclosure. The microfluidic delivery system 10 includes a housing 12 having an upper surface 14, a lower surface 16, and a body portion 18 between the upper and lower surfaces. The upper surface of the housing 12 includes a first hole 20 that places an environment external to the housing 12 in fluid communication with an interior portion 22 of the housing 12. The interior portion 22 of the housing 12 includes a holder member 24 that holds a removable microfluidic refill cartridge 26. As will be explained below, the microfluidic delivery system 10 is configured to use thermal energy to deliver fluid from within the microfluidic refill cartridge 26 to an environment external to the housing 12.

Access to the interior portion 22 of the housing is provided by an opening 28 in the body portion 18 of the housing 12. The opening 28 is accessible by a cover or door 30 of the housing 12. In the illustrated embodiment, the door 30 rotates to provide access to the opening 28. Although the opening and door are located on the body portion of the housing, it is to be appreciated that the opening and door may also be located on the upper surface and the lower surface of the housing. Furthermore, it is to be appreciated that in other embodiments, the housing has two or more separable parts for providing access to the interior portion.

The holder member 24 includes an upper surface 32 and a lower surface 34 that are coupled together by one or more sidewalls 36 and has an open side 38 through which the microfluidic refill cartridge 26 can slide in and out. The upper surface 32 of the holder member includes an opening 40 that is aligned with the first hole 20 of the housing 12.

The holder member 24 holds the microfluidic refill cartridge 26 in position when located therein. In one embodiment, the holder member 24 elastically deforms, thereby gripping the microfluidic refill cartridge 26 in place when located in the holder member. In another embodiment, the holder member 24 includes a locking system (not shown) for holding the microfluidic refill cartridge in place. In one embodiment, the locking system includes a rotatable bar that extends across the open side of the holder member to hold the microfluidic refill cartridge in place.

The housing 12 includes conductive elements (not shown) that couple electrical components throughout the system as is well known in the art. The housing 12 may further include connection elements for coupling to an external or internal power source. The connection elements may be a plug configured to be plugged into an electrical outlet or battery terminals. The housing 12 may include a power switch 42 on a front of the housing 12.

Figure 2A:
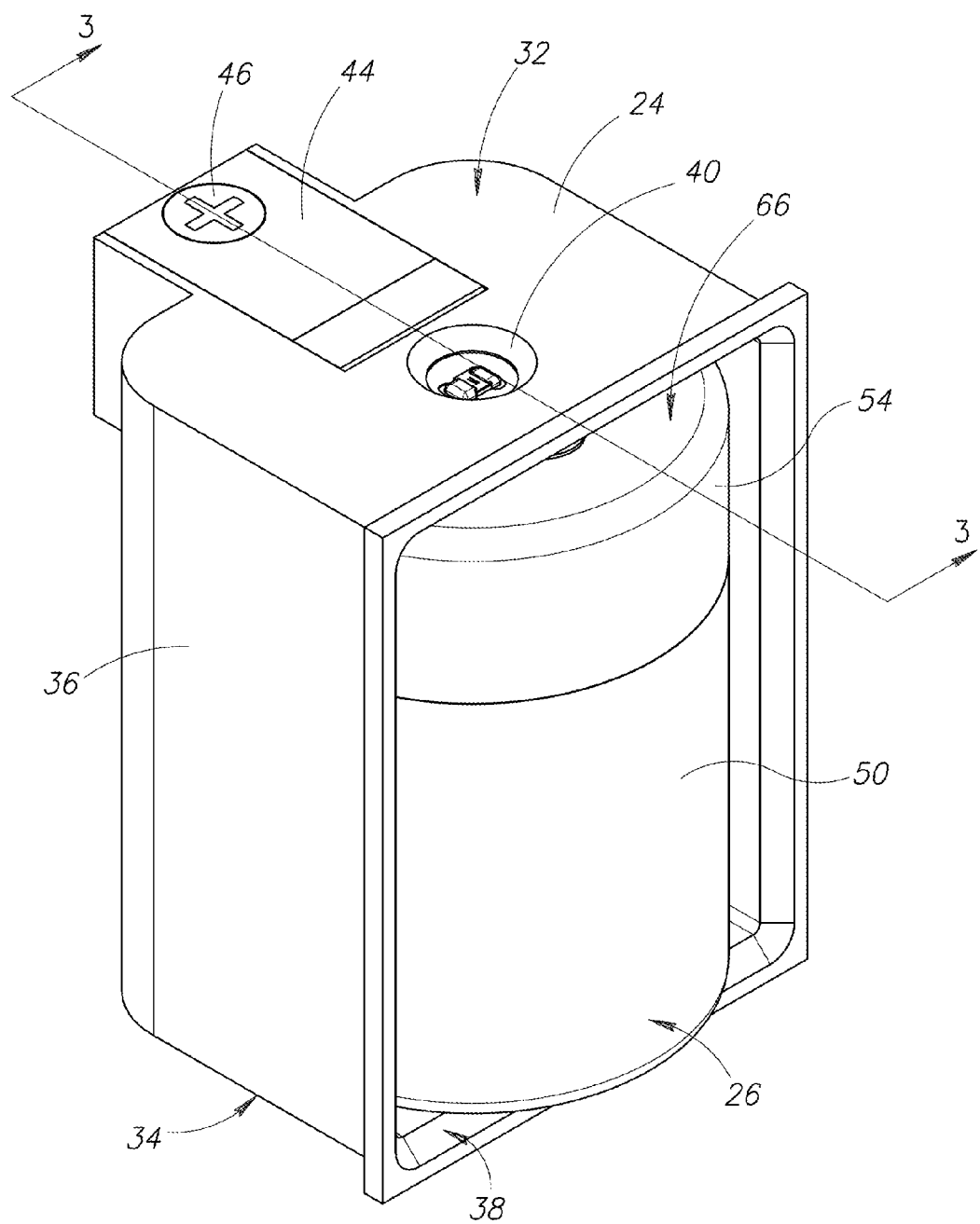
FIGS. 2A-2B are schematic isometric views of a microfluidic refill cartridge and a holder in accordance with one embodiment.
Figure 2B:
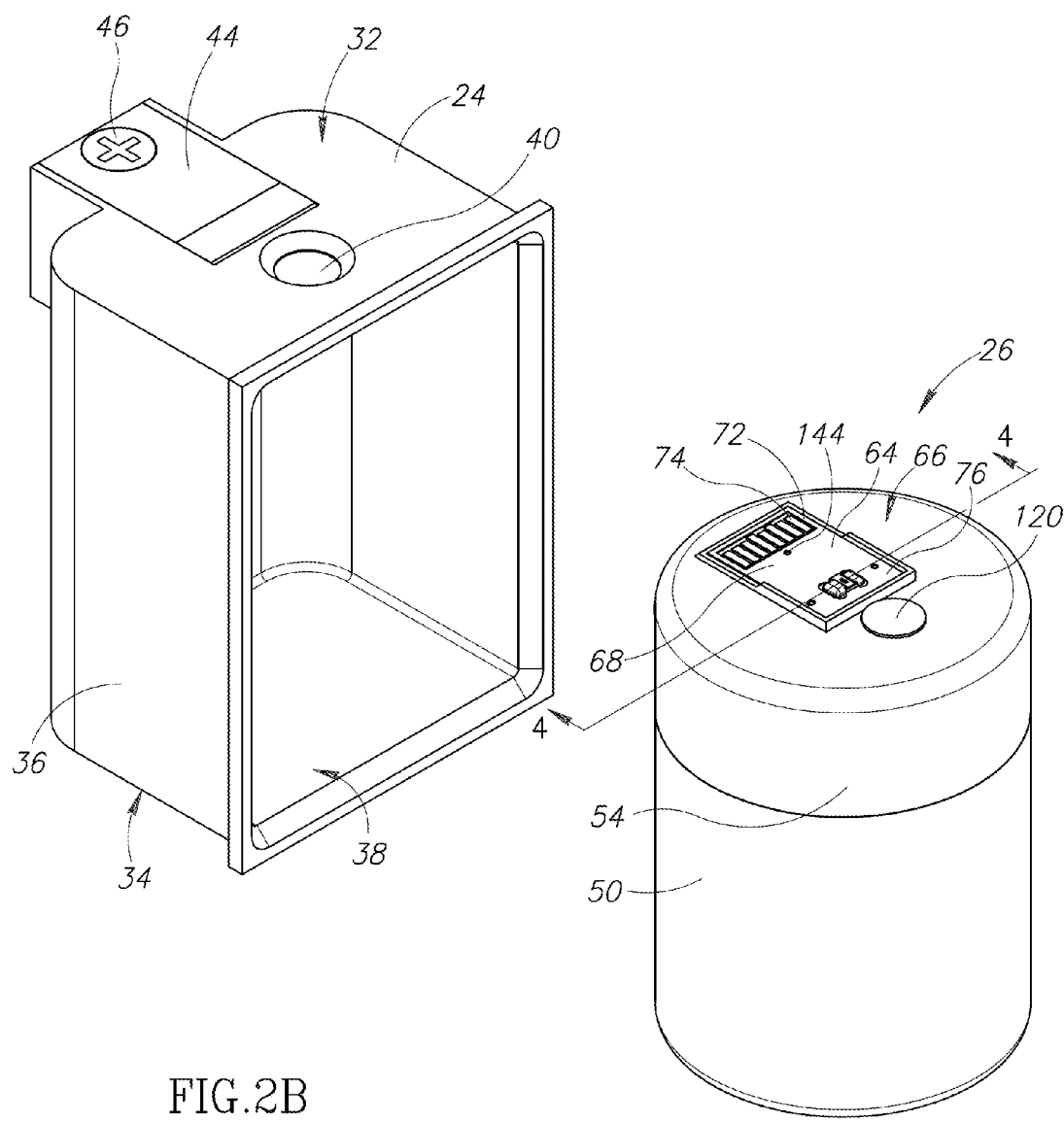

FIG. 2A shows the microfluidic refill cartridge 26 in the holder member 24 without the housing 12, and FIG. 2B shows the microfluidic refill cartridge 26 removed from the holder member 24. A circuit board 44 is coupled to the upper surface 32 of the holder member by a screw 46. As will be explained in more detail below, the circuit board 44 includes electrical contacts 48 (FIG. 3) that electrically couple to contacts of the microfluidic refill cartridge 26 when the cartridge is placed in the holder member. The electrical contacts 48 of the circuit board 44 are in electrical communication with the conductive elements.

Figure 3:
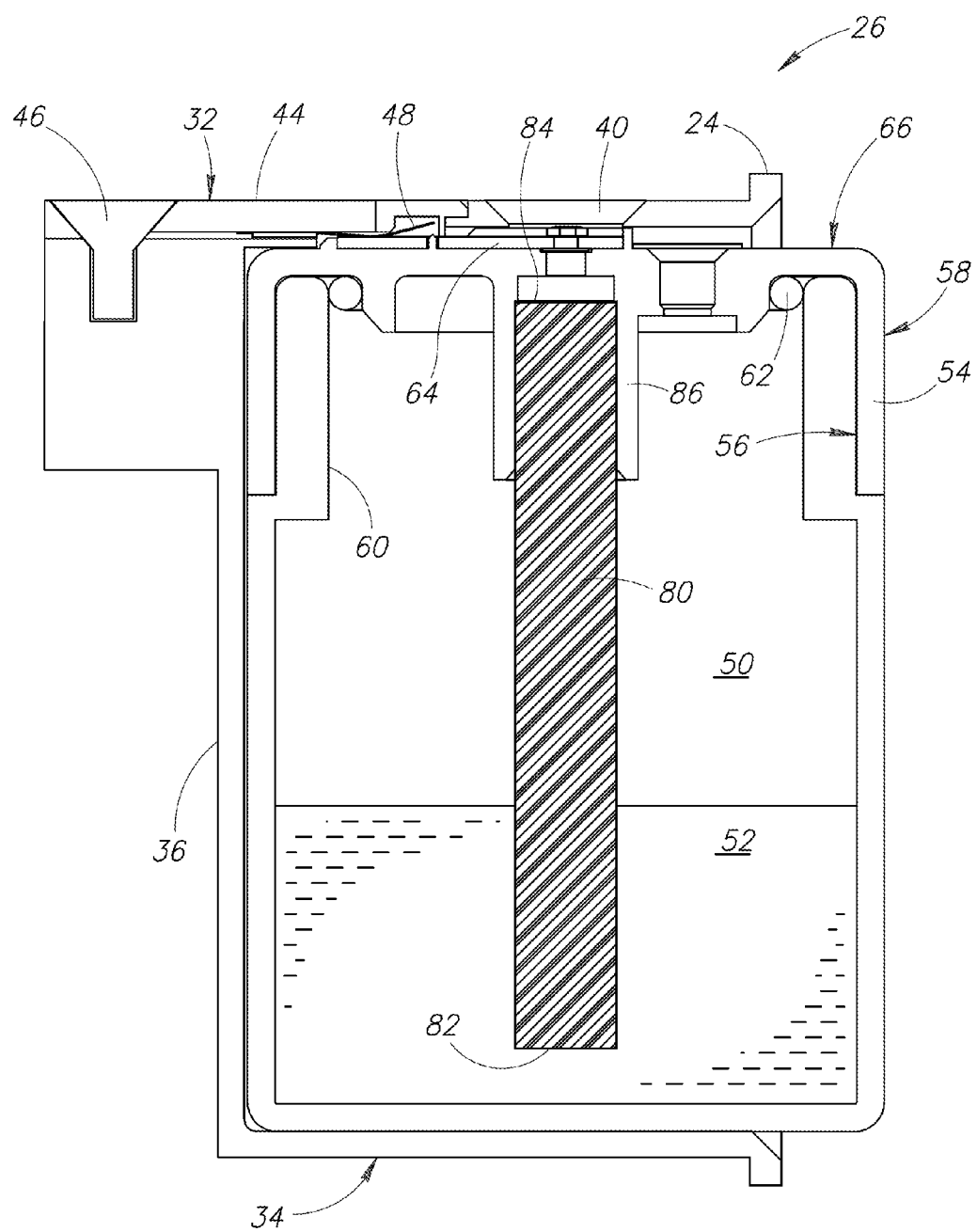
FIG. 3 is a cross-section schematic view of line 3-3 in FIG. 2A.

FIG. 3 is a cross-section view of the microfluidic refill cartridge 26 in the holder member 24 along the line 3-3 shown in FIG. 2A. With reference to FIG. 2B and FIG. 3, the microfluidic refill cartridge 26 includes a reservoir 50 for holding a fluid 52. The reservoir 50 may be any shape, size, or material configured to hold any number of different types of fluid. The fluid held in the reservoir may be any liquid composition. In one embodiment, the fluid is an oil, such as a scented oil. In another embodiment, the fluid is water. It may also be alcohol, a perfume, a biological material, a polymer for 3-D printing, or other fluid.

A lid 54, having an inner surface 56 and an outer surface 58, is secured to an upper portion 60 of the reservoir 50 to cover the reservoir 50. The lid 54 may be secured to the reservoir in a variety of ways known in the art. In some embodiments, the lid 54 is releasably secured to the reservoir 50. For instance, the lid 54 and the upper portion 60 of the reservoir 50 may have corresponding threads, or the lid 54 may snap onto the upper portion 60 of the reservoir 54. Between the lid 54 and the reservoir 50 there may be an O-ring 62 for forming a seal therebetween. The seal may prevent fluid from flowing therethrough as well as prevent evaporation of the fluid to an external environment.

A microfluidic delivery member 64 is secured to an upper surface 66 of the lid 54 of the microfluidic refill cartridge 26 as is best shown in FIG. 2B. The microfluidic delivery member 64 includes an upper surface 68 and a lower surface 70 (see also FIG. 4). A first end 72 of the upper surface 68 includes electrical contacts 74 for coupling with the electrical contacts 48 of the circuit board 44 when placed in the holder member 24. As will be explained in more detail below, a second end 76 of the microfluidic delivery member 64 includes a fluid path for delivering fluid therethrough.

In reference to FIG. 3, inside the reservoir 50 is a fluid transport member 80 that has a first end 82 in the fluid 52 in the reservoir and a second end 84 that is above the fluid 52. The fluid 52 travels from the first end 82 of the fluid transport member 80 to the second end 84 by capillary action. In that regard, the fluid transport member 80 includes one or more porous materials that allow the fluid to flow by capillary action. The construction of the fluid transport member 80 permits fluid to travel through the fluid transport member 80 against gravity. Fluid can travel by wicking, diffusion, suction, siphon, vacuum, or other mechanism. The second end 84 of the transport member is located below the microfluidic delivery member 64. The fluid transport member 80 delivers fluid 52 from the reservoir 50 toward the microfluidic delivery member 64.

Figure 4:
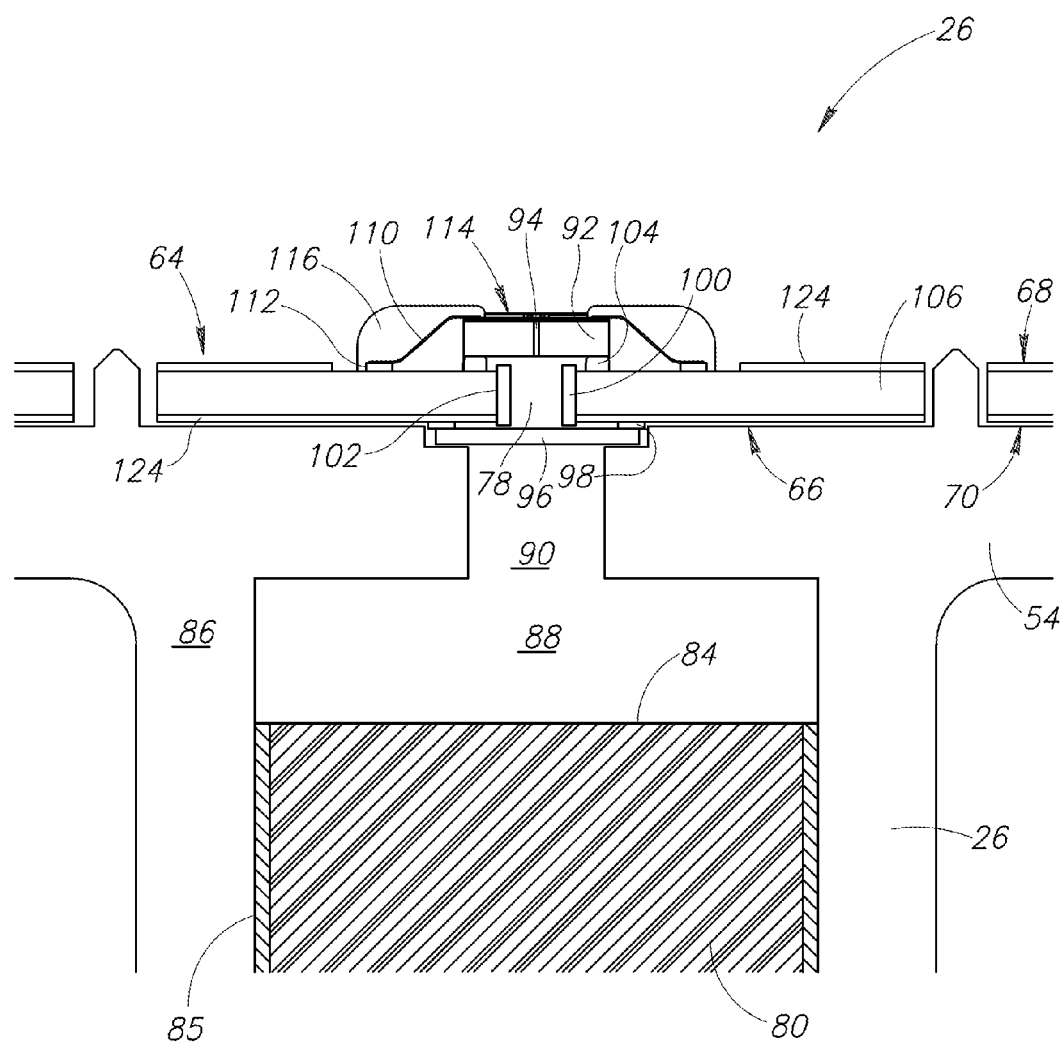
FIG. 4 is a cross-section schematic view of line 4-4 in FIG. 2B.

As best shown in FIG. 4, the second end 84 of the fluid transport member 80 is surrounded by a transport cover 86 that extends from the inner surface of the lid 54. The second end 84 of the fluid transport member 80 and the transport cover 86 form a chamber 88. The chamber 88 may be substantially sealed between the transport cover 86 and the second end 84 of the fluid transport member 80 to prevent air from the reservoir 50 from entering the chamber 88.

Above the chamber 88 is a first through hole 90 in the lid 54 that fluidly couples the chamber 88 above the second end 84 of the fluid transport member 80 to a second through hole 78 of the microfluidic delivery member 64. The microfluidic delivery member 64 is secured to the lid 54 above the first through hole 90 of the lid 54 and receives fluid therefrom.

In some embodiments, the fluid transport member 80 includes a polymer; non-limiting examples include polyethylene (PE), including ultra-high molecular weight polyethylene (UHMW), polyethylene terephthalate (PET), polypropylene (PP), nylon 6 (N6), polyester fibers, ethyl vinyl acetate, polyvinylidene fluoride (PVDF), and polyethersulfone (PES), polytetrafluroethylene (PTFE). The fluid transport member 80 may be in the form of woven fibers or sintered beads. It is also to be appreciated that the fluid transport member of the present disclosure is of smaller size than is typically used for fluid transport members for refillable cartridges.

As shown in FIG. 4, the fluid transport member 80 may include an outer sleeve 85 that surrounds radial surfaces of the fluid transport member 80 along at least a portion of its length while keeping the first and second ends 82, 84 of the fluid transport members 80 exposed. The sleeve 85 may be made from a non-porous material or a material that is less porous than the fluid transport member 80. In that regard, the sleeve 85 may prevent or at least reduce air in the reservoir from entering the fluid transport member 80 by radial flow.

The outer sleeve 85 may be a material that is wrapped around the fluid transport member 80. In other embodiments, the sleeve 85 is formed on the fluid transport member 80 in an initial liquid state that dries or sets on the fluid transport member. For instance, the material may be sprayed on the fluid transport member or the fluid transport member may be dipped into a liquid material that dries. The outer sleeve may be a polymer sheet, a Teflon tape, a thin plastic layer, or the like. Teflon tape has particular benefits since it provides a fluid-tight seal, is flexible to wrap, is strong, and also makes it easy to slip around the fluid transport member 80.

The fluid transport member 80 may be any shape that is able to deliver fluid 52 from the reservoir 50 to the microfluidic delivery member 64. Although the fluid transport member 80 of the illustrated embodiment has a width dimension, such as diameter, that is significantly smaller than the reservoir, it is to be appreciated that the diameter of the fluid transport member 80 may be larger and in one embodiment substantially fills the reservoir 50.

Figure 5A:
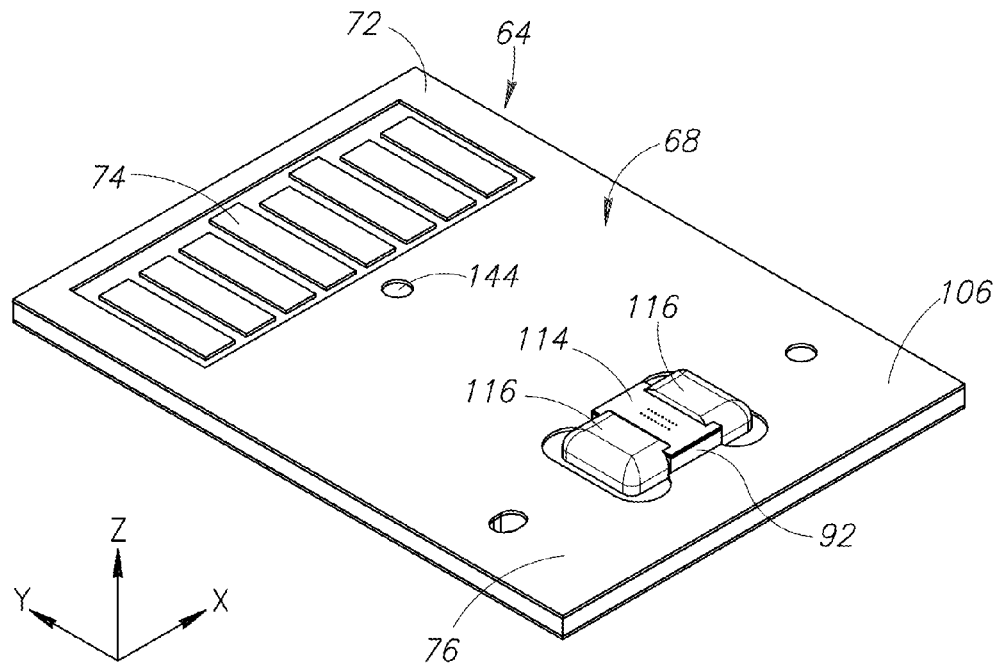
FIGS. 5A-5B are schematic isometric views of a microfluidic delivery member in accordance with an embodiment.
Figure 5B:
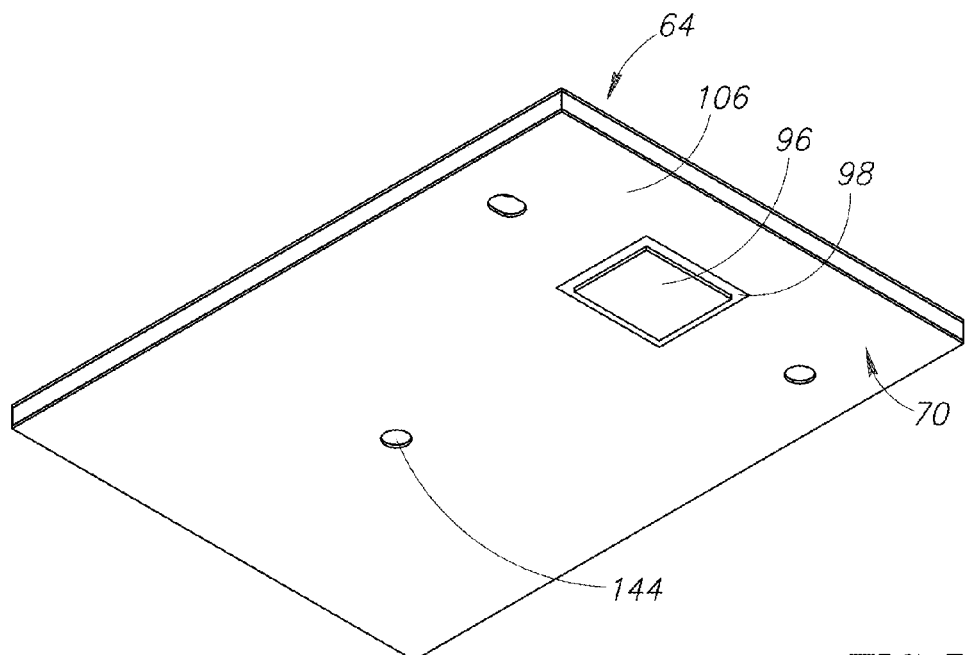
Figure 5C:
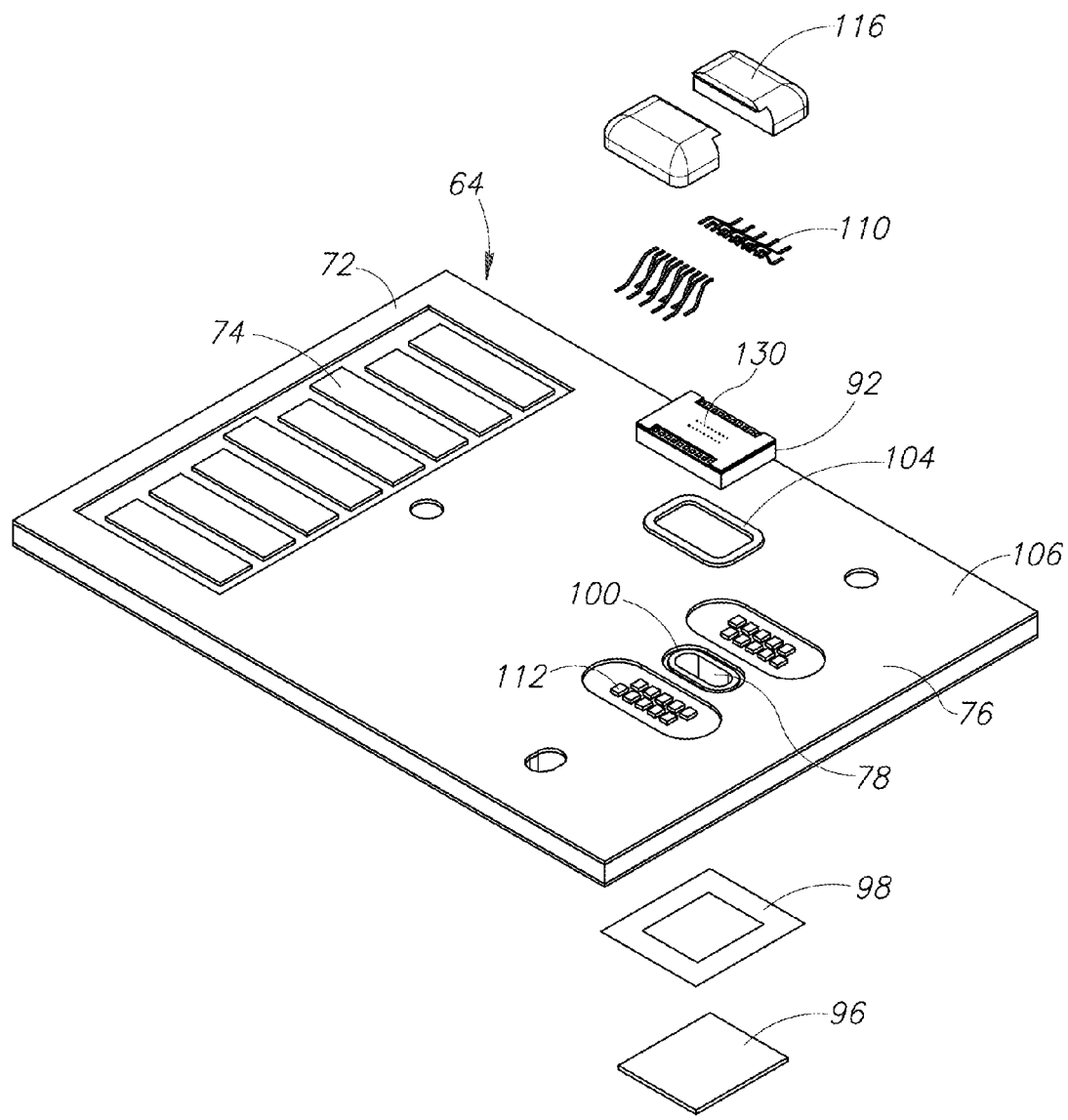
FIG. 5C is an exploded view of the structure in FIG. 5A.

FIGS. 5A and 5B, respectively, are top and bottom views of the microfluidic delivery member 64 in accordance with one embodiment. FIG. 5C illustrates the microfluidic delivery member 64 in exploded view. The microfluidic delivery member 64 includes a rigid planar circuit board, which can be a printed circuit board (PCB) 106 having the upper and lower surfaces 68, 70. The PCB 106 includes one or more layers of insulative and conductive materials as is well known in the art. In one embodiment, the circuit board includes FR4, a composite material composed of woven fiberglass cloth with an epoxy resin binder that is flame resistant. In other embodiments, the circuit board includes ceramic, glass or plastic. The PCB 106 may include a vent hole 144 that is in fluid communication with the reservoir 50 to equalize pressure in the reservoir 50 as fluid 52 is removed from the reservoir.

The upper surface 68 of the second end 76 of the printed circuit board 106 includes a semiconductor die 92 above the second through hole 78 and leads 112 located proximate the die 92. Electrical contacts 74 at the first end 72 of the microfluidic delivery member 64 are coupled to one or more of the leads 112 at the second end 76 by electrical traces (not shown).

The upper and lower surfaces 68, 70 of the PCB 106 may be covered with a solder mask 124 as shown in the cross-section view of FIG. 4. Openings in the solder mask 124 may be provided where the leads 112 are positioned on the circuit board or at the first end 72 where the electrical contacts 74 are formed. The solder mask 124 may be used as a protective layer to cover electrical traces.

The die 92 is secured to the upper surface 68 of the printed circuit board 106 by any adhesive material 104 configured to hold the semiconductor die to the PCB. The adhesive material may be an adhesive material that does not readily dissolve by the fluid in the reservoir. In some embodiments, the adhesive material is activated by heat or UV. In some embodiments, a mechanical support (not shown) may be provided between a bottom surface 108 of the die 92 and the upper surface 68 of the printed circuit board 106.

Figure 6:
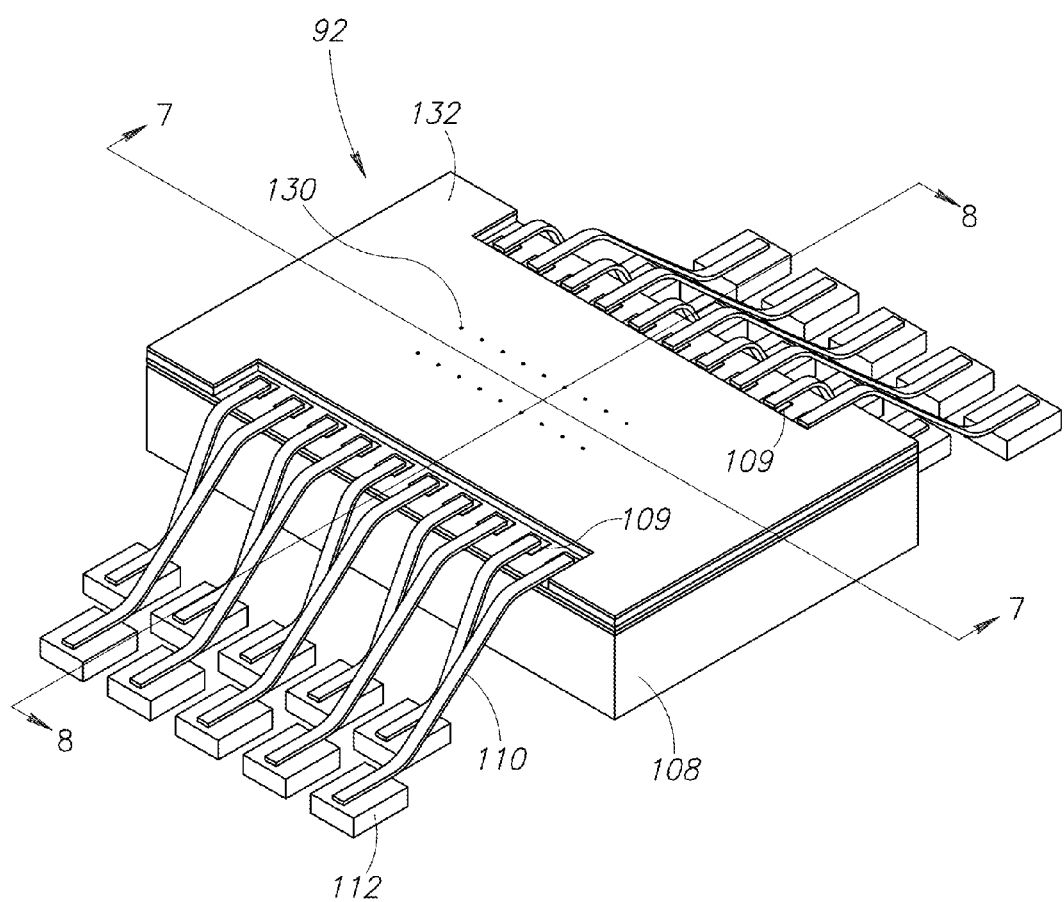
FIG. 6 is a schematic top view of a die in accordance with one embodiment.

As best shown in FIG. 6, the die 92 includes a plurality of bond pads 109 that are electrically coupled to one or more of the leads 112 by conductive wires 110. That is, a first end of the conductive wires 110 is coupled to a respective bond pad 109 of the die 92 and a second end of the conductive wires 110 is coupled to a respective lead 112. Thus, the bond pads 109 of the die 92 are in electrical communication with the electrical contacts 74 of the microfluidic delivery member 64. A molding compound or encapsulation material 116 may be provided over the conductive wires 110, bond pads 109, and leads 112, while leaving a central portion 114 of the die 92 exposed.

Figure 7A:
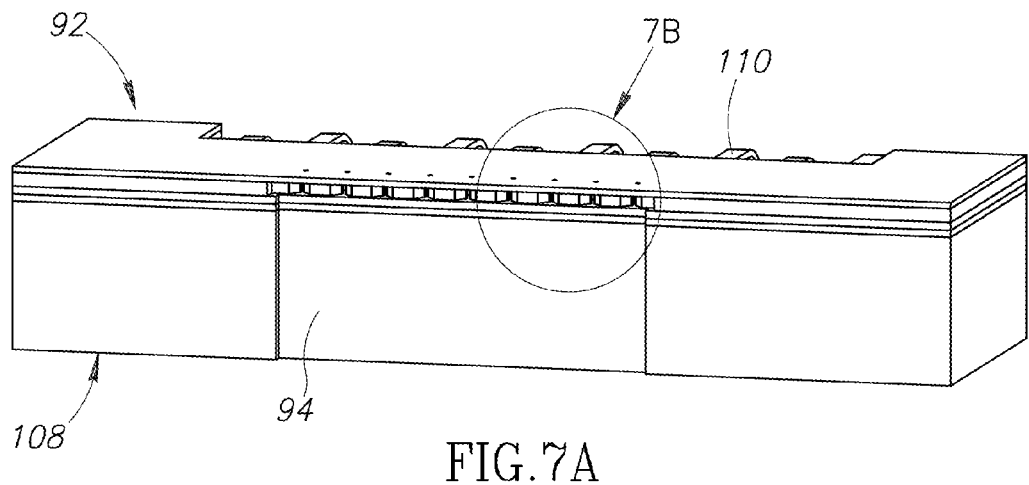
FIG. 7A is a cross-section schematic view of line 7-7 in FIG. 6.
Figure 7B:
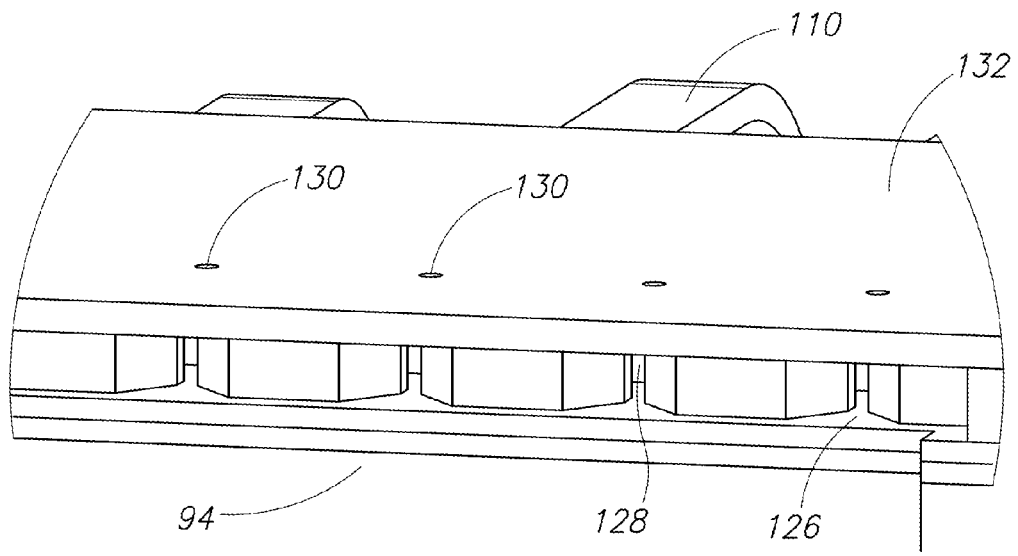
FIG. 7B is an enlarged view of a portion of FIG. 7A.
Figure 8A:
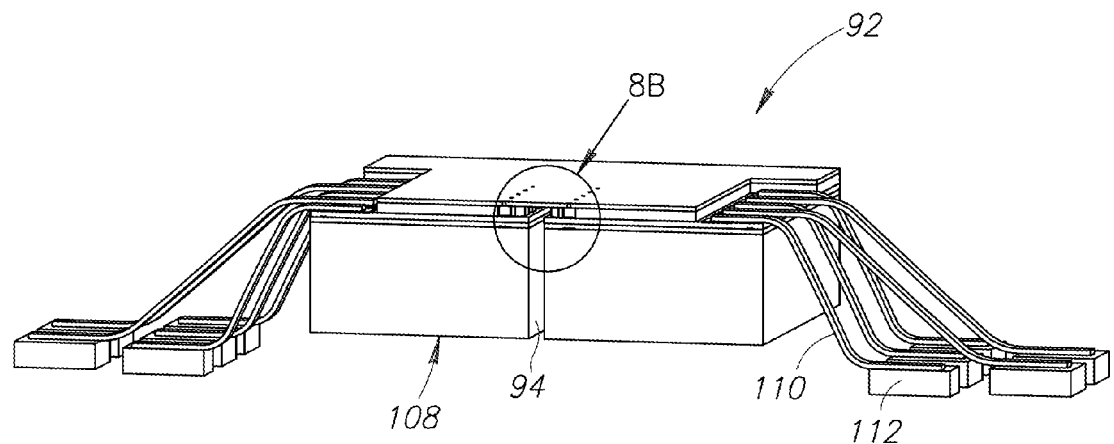
FIG. 8A is a cross-section schematic view of line 8-8 in FIG. 6.

As best shown in FIG. 4, the die 92 includes an inlet path 94 in fluid communication with the second through hole 78 on the second end 76 of the microfluidic delivery member 64. With reference also to FIGS. 7 and 8, which illustrate corresponding cross sections of the die of FIG. 6, the inlet path 94 of the die 92 is in fluid communication with a channel 126 that is in fluid communication with individual chambers 128 and nozzles 130, forming a fluid path through the die 92. Above the chambers 128 is a nozzle plate 132 that includes the plurality of nozzles 130. In a first embodiment, each nozzle 130 is located above a respective one of the chambers 128 and is an opening in the nozzle plate 132 that is in fluid communication with an environment outside of the microfluidic refill cartridge 26. The die 92 may have any number of chambers 128 and nozzles 130, including one chamber and nozzle. In the illustrated embodiment, the die 92 includes 18 chambers 128 and 18 nozzles 130, each chamber associated with a respective nozzle. Alternatively, it can have 10 nozzles and 2 chambers, one chamber providing fluid for a bank of five nozzles. It is not necessary to have a one-to-one correspondence between the chambers and nozzles. In one embodiment, the nozzle plate 132 is 12 microns thick. In some embodiments, the nozzle 130 has a diameter between 20-30 microns.

Figure 8B:
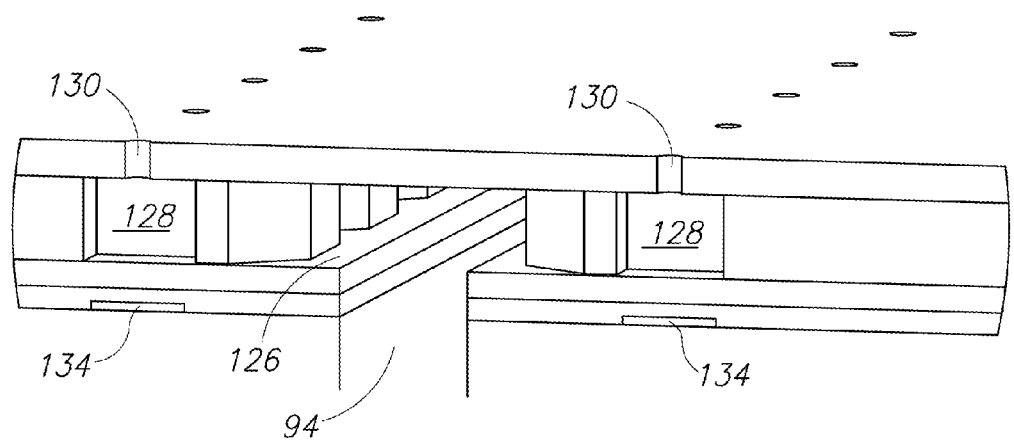
FIG. 8B is an enlarged view of a portion of FIG. 8A.

As is best shown in FIG. 8B, proximate each chamber 128 is a heating element 134 that is electrically coupled to and activated by an electrical signal being provided by a bond pad of the die 92. In use, when the fluid in each of the chambers 128 is heated by the heating element 134, the fluid vaporizes to create a vapor bubble. The expansion that creates the vapor bubble causes a droplet to form and eject from the nozzle 130. Other ejection elements may be used for causing fluid to be ejected from the nozzle 130. For instance, piezoelectric elements or ultrasonic fluid ejection elements may be used to cause fluid to be ejected through the nozzles 130 as is well known in the art.

Each nozzle 130 is in fluid communication with the fluid in the reservoir by a fluid path that includes the first end 82 of the fluid transport member 80, through the transport member to the second end 84, the chamber 88 above the second end 84 of the transport member, the first through hole 90 of the lid, the second through hole 78 of the PCB, through the inlet path 94 of the die, through the channel 126, to the chamber 128, and out of the nozzle 130 of the die 92.

In reference again to FIG. 4, a filter 96 is positioned between the chamber 88 and inlet path 94 of the die 92. The filter 96 is configured to prevent at least some particles from passing therethrough, thereby preventing and/or reducing blockage in the downstream fluid path, most particularly in the nozzles 130 of the die 92. In some embodiments, the filter 96 is configured to block upstream particles that are greater than one third of the diameter of the nozzles.

The filter 96 may be any material that blocks particles from flowing therethrough and does not break apart when exposed to the fluid, which could create further particles to block the fluid path. In one embodiment, the filter 96 is a stainless steel mesh. In other embodiments, the filter 96 is a randomly weaved mesh and may comprise polypropylene or silicon.

Figure 9:
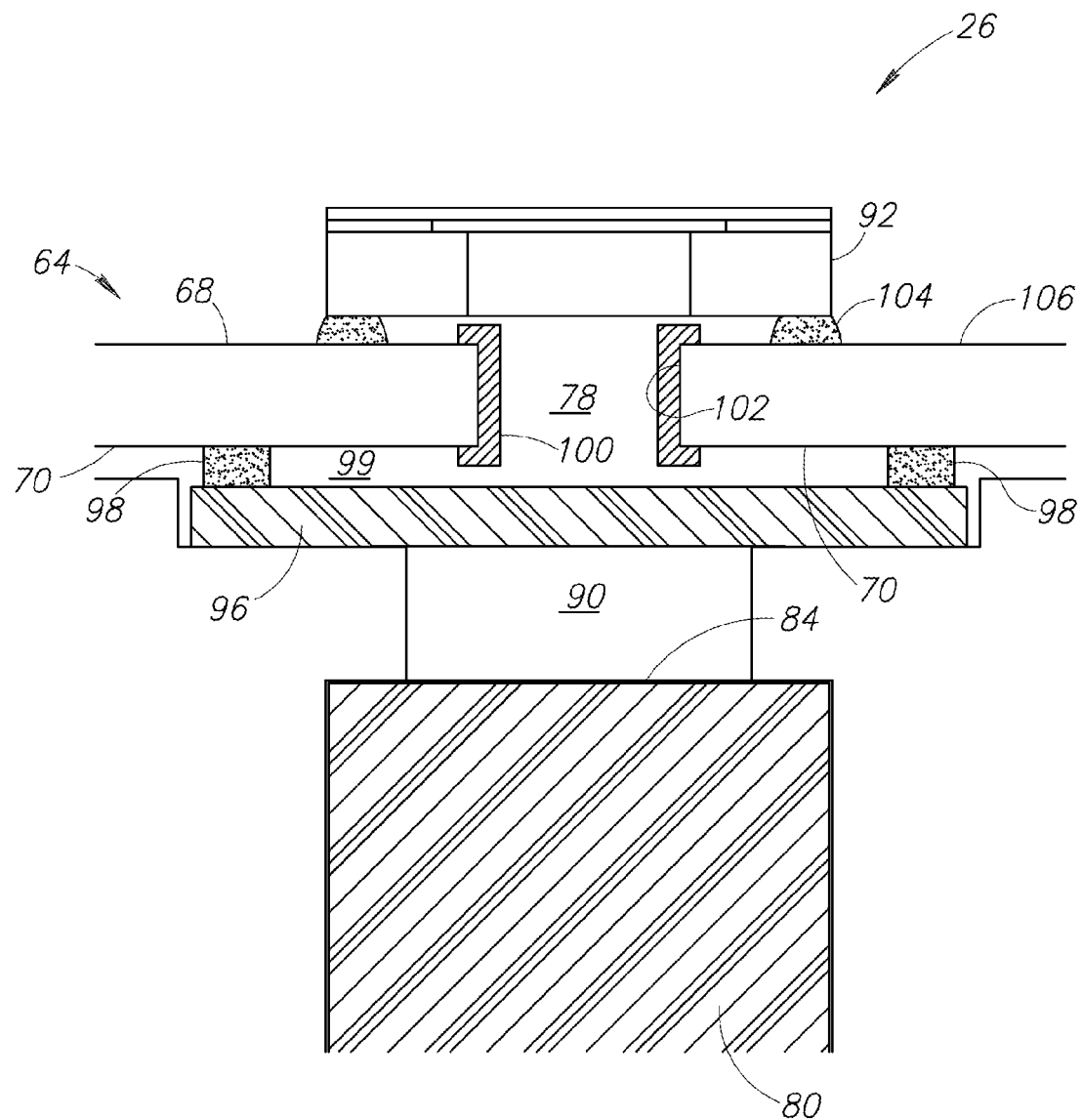
FIG. 9 is a cross-section schematic view of a fluid path of a microfluidic refill cartridge in accordance with one embodiment.

Referring now to FIG. 9, there is provided a close-up view of a portion of a microfluidic refill cartridge 26 illustrating a flow path with a filter 96 between the second end 84 of the fluid transport member 80 and the die 92 in accordance with one embodiment.

The filter 96 is separated from the lower surface 70 of the microfluidic delivery member 64 proximate the second through hole 78 by a first mechanical spacer 98. The first mechanical spacer 98 creates a gap 99 between the lower surface 70 of the microfluidic delivery member 64 and the filter 96 proximate the second through hole 78. In that regard, the outlet of the filter 96 is greater than the diameter of the second through hole 78 and is offset therefrom so that a greater surface area of the filter 96 can filter fluid than would be provided if the filter 96 was attached directly to the lower surface 70 of the microfluidic delivery member 64 without the mechanical spacer 98. It is to be appreciated that the mechanical spacer 98 allows suitable flow rates through the filter 96. That is, as the filter 96 clogs up with particles, the filter 96 will not slow down the fluid being provided to the second through hole 78. In one embodiment, the outlet of the filter is 4 mm$^2$ or larger and the first mechanical spacer 98 is between 100 and 700 microns thick.

The first mechanical spacer 98 may be a separate rigid support, a protrusion formed on the lower surface 70 of the microfluidic delivery member 64, such as the solder mask, or adhesive material that conforms to a shape that provides an adequate distance between the filter 96 and the lower surface 70 of the microfluidic delivery member 64. The adhesive material may be an adhesive material that does not readily dissolve by the fluid in the reservoir. In some embodiments, the adhesive material is activated by heat or UV. The adhesive material may be the same or different from the adhesive material used to secure the die 92 to the microfluidic delivery member 64.

It is to be appreciated that in some embodiments, the fluid transport member 80 is made from one or more materials that do not react with the fluid. Thus, the fluid transport member 80 does not introduce contaminants into the fluid that could block fluid flow through the microfluidic delivery member 64.

As shown in FIG. 9, the second through hole 78 of the microfluidic delivery member 64 may include a liner 100 that covers exposed sidewalls 102 of the PCB 106. The liner 100 may be any material configured to protect the PCB 106 from breaking apart, such as to prevent fibers of the PCB from separating. In that regard, the liner 100 may protect against particles from the PCB 106 entering into the fluid path and blocking the nozzles 130. For instance, the sidewalls 102 of the second through hole 78 may be lined with a material that is less reactive to the fluid in the reservoir than the material of the PCB 106. In that regard, the PCB 106 may be protected as the fluid passes therethrough. In one embodiment, the sidewalls 102 of the second through hole 78 are coated with a metal material, such as gold. As mentioned above, the upper and lower surfaces 68, 70 of the PCB 106 may be covered by a solder mask, which can protect the PCB material from the fluid.

Figure 10:
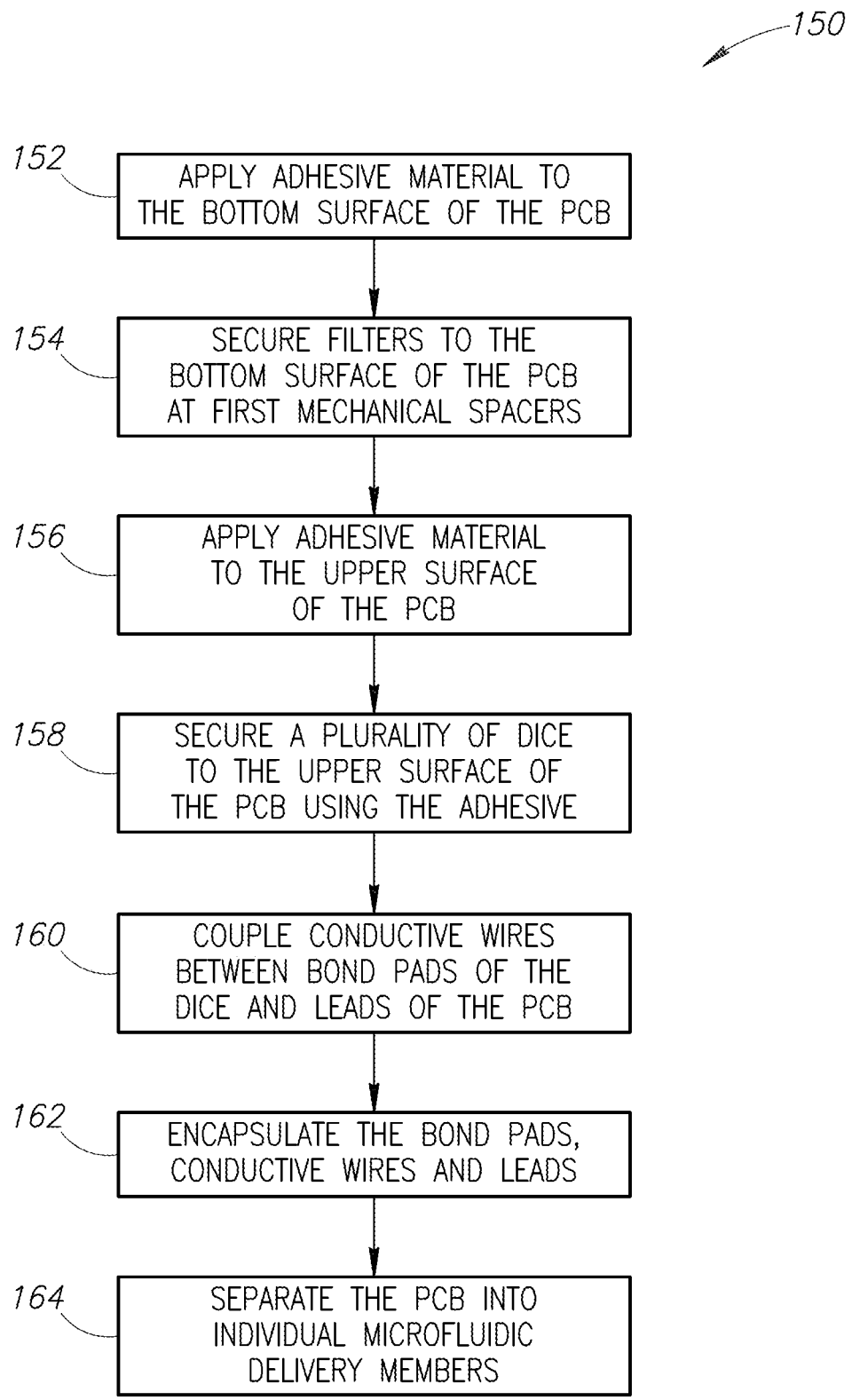
FIG. 10 is a flow chart illustrating a method of assembling a microfluidic delivery member in accordance with one embodiment.

FIG. 10 illustrates a method 150 of assembling a plurality of microfluidic delivery members, such as the microfluidic delivery member 64 shown in FIG. 9, in accordance with one embodiment. The method 150 includes applying adhesive material 104 to a bottom surface of a PCB strip 106a as shown by step 152. The PCB strip 160a will have openings formed therein for the second through holes 78. The sidewalls of the openings may be lined as discussed above.

At step 154, filters 96 are secured to the lower surface 70 of the PCB strip 106a using the adhesive 104. The filters 96 are secured at first mechanical spacers 98. That is, the first mechanical spacers 98 may be already secured or formed on the lower surface 70 of the PCB strip 106a. For instance, the mechanical spacer 98 may be formed from a solder mask material that is provided on the lower surface 70 of the PCB strip 106a. In that regard, the solder mask material is thicker at locations on the PCB strip 106a for forming the mechanical spacer 98. Alternatively, the first mechanical spacer 98 may attached to the lower surface 70 of the PCB strip 106a using the adhesive. Then the filter 96 is secured to the first mechanical spacer 98 with further adhesive. It is to be appreciated that the filter 96 may be attached directly to the lower surface 70 of the PCB strip 106a with the adhesive 104 acting as the first mechanical spacer 98 as recited above. If the adhesive is activated by heat or UV, the method would further include a baking step or UV exposure to secure the filter and first mechanical spacer to the bottom surface of the PCB.

Adhesive 104 may be applied to the upper surface 68 of the PCB strip 106a at step 156. Semiconductor dice, such as the die 92, are secured to the upper surface 68 of the PCB strip 106a using the adhesive 104 at step 158. Again, the securing step may include a baking step or UV exposure to activate the adhesive.

It is to be appreciated that the fluid path through the second through hole 78 of the PCB strip 106a between the semiconductor die 92 and the filter 96 is quite small. In that regard, there is little surface area for contaminants to be located downstream of the filter 96, that is, between the filter 96 and the nozzles 130. Additionally, the die and the filter are attached to the PCB without other steps therebetween, thereby reducing the chances of contaminants from getting downstream of the filter. In that regard, the above steps may be performed quickly. Finally, the steps indicated above may be performed in a class 1000 cleanroom environment, reducing the number of contaminants in the air and thereby reducing the likelihood of contaminants from getting in the fluid path downstream from the filter 96.

The method continues with electrically coupling the dice 92 to the PCB strip 106a by coupling first ends of conductive wires 110 to bond pads 109 on the die 92, respectively, and coupling second ends of the conductive wires 110 to the leads 112 of the PCB strip 106a, respectively at step 160. The bond pads, conductive wires, and the leads are encapsulated with an encapsulation material 116 at step 162. The PCB strip 106a may be singulated by dicing, such as by, laser cutting, sawing, and the like, into a plurality of microfluidic delivery members 64 as indicated by step 164.

Figure 11A:
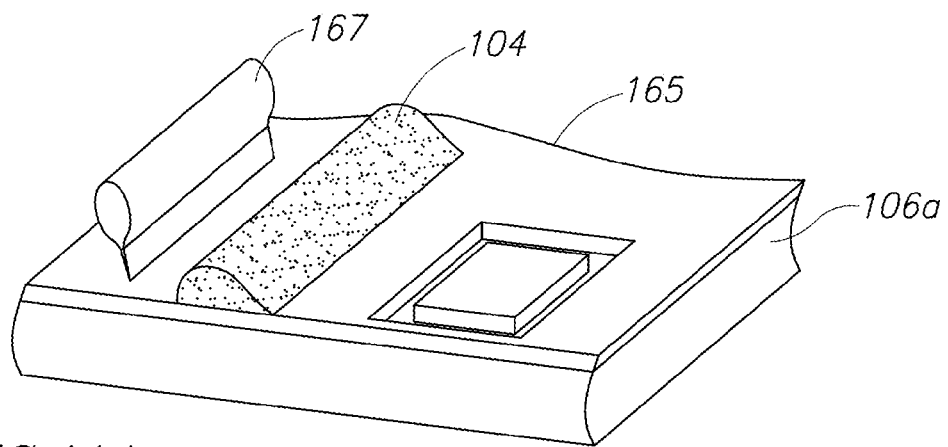
FIGS. 11A-11C are schematic illustrations of a method of applying adhesive to a surface of a PCB strip in accordance with one embodiment.
Figure 11B:
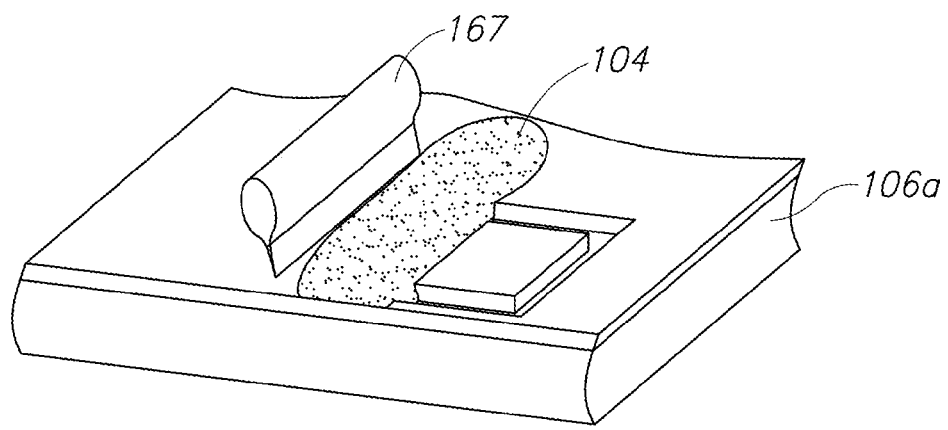
Figure 11C:
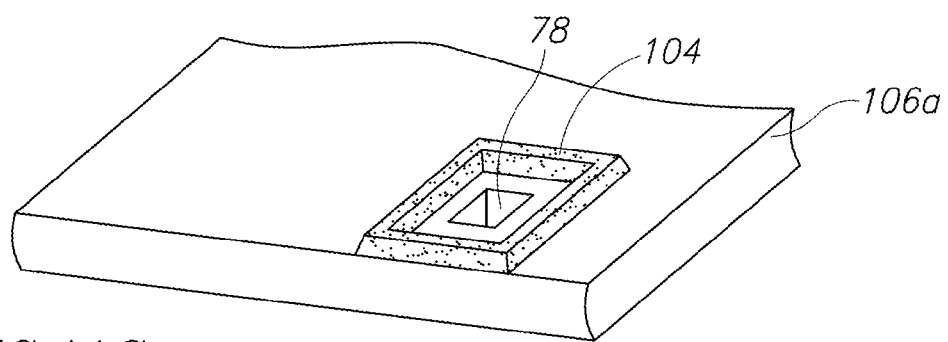

In one embodiment, the adhesive material 104 may be applied to the upper surface 68 and/or lower surface 70 of the PCB strip 106a using screen printing techniques as illustrated in FIGS. 11A-11C. In that regard, a screen stencil 165 may be placed over the upper surface of the PCB strip 106a. The screen stencil 165 has openings 166 or a mesh layer at locations in which the adhesive is to be applied to the PCB strip 106a. Adhesive 104 is deposited on the screen stencil 165 as shown in FIG. 11A, and a squeegee 167 may be used to spread the adhesive 104 in the openings 166 or mesh layer as shown in FIG. 11B. The squeegee 167 may be passed over the screen stencil 165 multiple times in order to fill the openings 166 or mesh layers in the screen stencil 165. The screen stencil 165 is then removed, and the assembly of the microfluidic delivery members 64 continues as indicated above.

Figure 12:
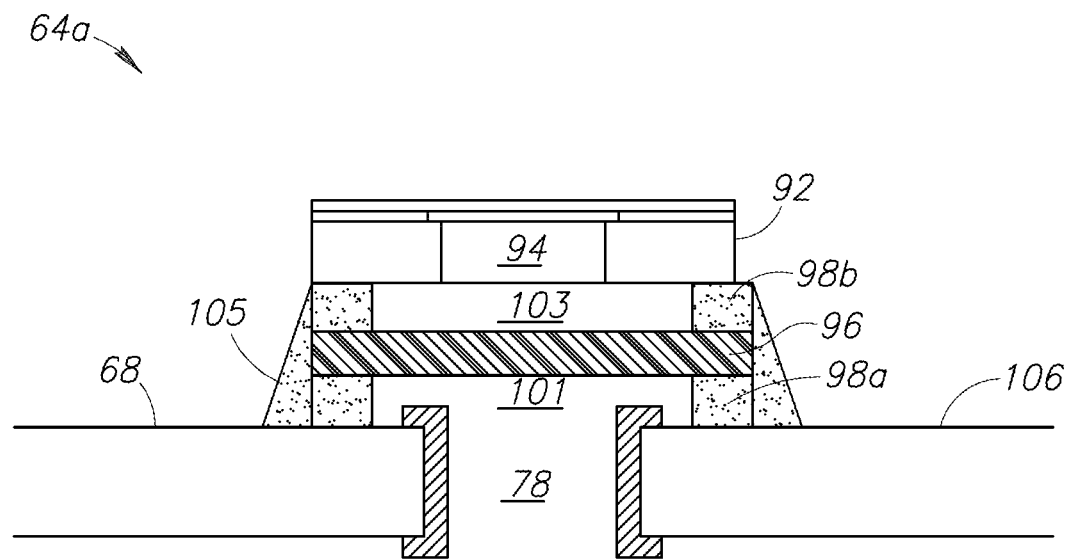
FIG. 12 is a cross-section schematic view of a fluid path into a microfluidic delivery member in accordance with another embodiment.

FIG. 12 shows a microfluidic delivery member 64a in accordance with another embodiment. The microfluidic delivery member 64a has the filter 96 and the die 92 on the same side, the upper surface 68, of the PCB 106. In particular, the filter 96 is secured to the upper surface 68 of the PCB 106 and the die 92 is secured to the filter 96. A first mechanical spacer 98a is provided between the upper surface 68 of the PCB 106 and the filter 96 to allow a greater surface area of flow therethrough. A second mechanical spacer 98b may also be provided between the filter 96 and the die 92. The first mechanical spacer 98a creates a gap 101 between the filter 96 and the upper surface 68 of the PCB 106. Similarly, the second mechanical spacer 98b creates a gap 103 between the filter 96 and the die 92. Thus, the surface areas of the inlet and outlet of the filter 96 are larger than the inlet path 94 of the die 92. In that regard, as the filter 96 becomes clogged with particles from the fluid, the flow through the filter 96 does not affect the fluid flow through the inlet path 94 of the die 92. In some embodiments, the filter 96 may be sealed, such as by a sealant 105, on the outer edges to prevent fluid from flowing therethrough. Although the filter 96 is shown as the same size as the die 92, the filter 96 may also be smaller or larger than the die 92.

Figure 13:
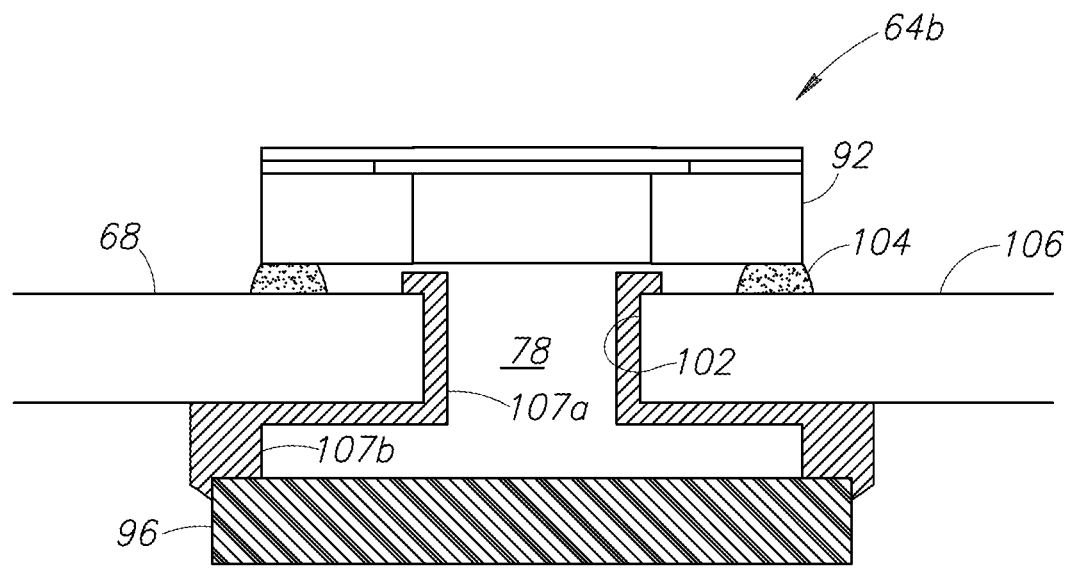
FIG. 13 is a cross-section schematic view of a fluid path into a microfluidic delivery member in accordance with another embodiment.

FIG. 13 is a cross-section schematic view of a fluid path into a microfluidic delivery member 64b in accordance with another embodiment. In the microfluidic delivery member 64b, the liner 107a and the first mechanical spacer 107b are formed of the same material and may be integrally formed. The liner 107a and the first mechanical spacer 107b perform the same function as the liner 100 and the first mechanical spacer 96. In one embodiment, the liner 107a and the first mechanical spacer 107b are formed by an insert molding process in which the filter 96 is inserted into the mold and the material for forming the liner 107a and the first mechanical spacer 107b is injected into the mold and configured to adhere to the filter 96. The liner 107a and the first mechanical spacer 107b may be formed from a plastic material, including a polymer, such as polyethylene terephthalate (PET), By attaching the filter to the die, the microfluidic delivery member has few a small pathways that could have contaminants therein that may block the filter. Furthermore, the filter and the die may be assembled in steps that are close together, which would also reduce the likelihood of contaminants getting therein.

Figure 14:
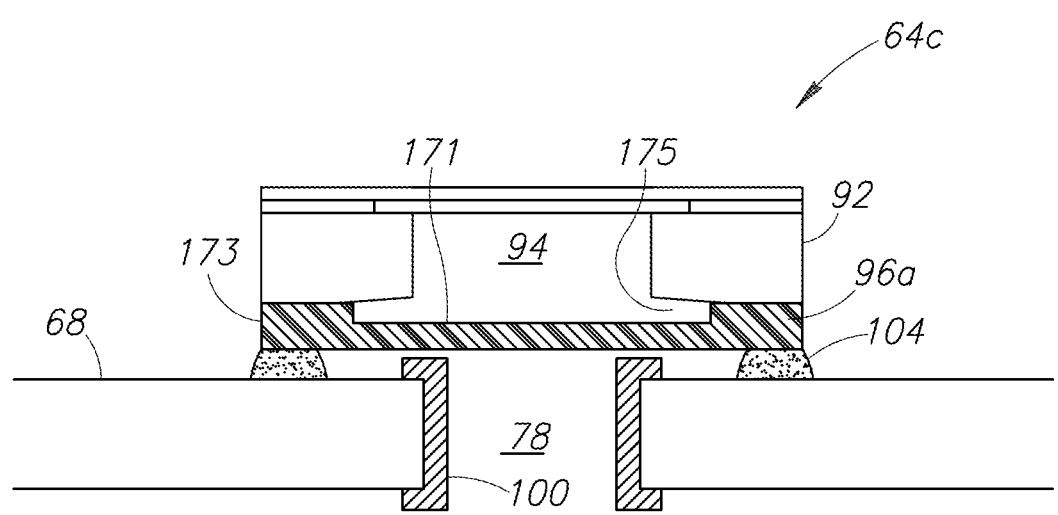
FIG. 14 is a cross-section schematic view of a fluid path into a microfluidic delivery member in accordance with yet another embodiment.

FIG. 14 is a cross-section schematic view of a fluid path into a microfluidic delivery member 64c in accordance with yet another embodiment. In the microfluidic delivery member 64c, a filter 96a is formed integrally in a substrate material, such as a silicon substrate. The filter 96a includes a filter portion 171 a filter body 173. The filter body 173 is secured to a bottom surface 108 of the die 92 by an adhesive material (not shown), including a paste, a glue, double sided tape or any other suitable adhesive. The filter portion 171 includes a plurality of holes formed in the substrate material that are configured to filter fluid that flows therethrough. In one embodiment the diameter of the holes is about one half of the diameter of the nozzles 130. In one embodiment, the holes are 10-12 microns.

Above the filter portion 171 is a channel 175 formed in the substrate material. The channel 175 is wider than the inlet 94 to the die 92. The filter body 173 thus can act as a spacer, such as the first mechanical spacer discussed above, to the die 92. In that regard, as the filter portion 171 becomes blocked (i.e. holes in the filter portion 171 become clogged with particles), the fluid flow through the inlet 94 may not be reduced.

The filter 96a may be formed by first forming the channel 175. In particular, a patterned mask layer may be formed over a first surface of the substrate and the substrate may be etched to a particular depth as is well known in the art, thereby forming the channel 175. The depth of the channel 175 may be any depth that provides adequate flow to the inlet 94 as the filter portion 171 clogs up with particles. In one embodiment, the channel 175 is 100 microns deep into the substrate and the width of the channel is 3-4 millimeters wider than the width of the inlet 94 to the die 92.

The plurality of holes of the filter portion 171 may also be formed using a patterned mask layer and etching as is well known in the art. The mask layer may be photoresist and the etching may be either wet or dry etch. In some embodiments, the filter portion 171 is about 100 microns thick.

It is to be appreciated that the die 92 may include a channel (not shown), such as the channel 175 of the filter 96a. In that regard, the filter 96a may not include the channel 175. In one embodiment, however, the filter 96a may also include channel 175. Thus, the channel of the die 92 and the channel 175 of the filter 96a together may provide adequate flow rates to the inlet 94 of the die 92.

Prior to use, the microfluidic refill cartridge 26 may be primed to remove air from the fluid path. During priming, air in the fluid path is replaced with fluid from the reservoir 50. In particular, fluid may be pulled up from the fluid transport member 80 to fill the chamber 88, the first through hole 90 of the lid 54, the second through hole 78 of the microfluidic delivery member 64, the inlet path 94 of the die 92, the channel 126, and the chamber 128. Priming may be performed by applying a vacuum force through the nozzles 130. The vacuum force is typically performed with the microfluidic refill cartridge in an upright position for a few seconds. In some embodiments, a vacuum force is applied for 30 to 60 seconds. The microfluidic refill cartridge 26 may also be primed by applying air pressure through a hole (not shown) in the lid 54 of the cartridge that is in fluid communication with the reservoir 50 to increase the air pressure on the fluid in the reservoir 50, thereby pushing fluid up the fluid transport member 80 through the fluid path. It is to be appreciated that the hole is sealed with a cover 120 (see FIG. 2B), such as elastic material that fits into at least a portion of the hole, after priming.

Once primed, the nozzles 130 may be sealed to prevent de-priming of the fluid path. De-priming may occur when air enters the fluid path. In that regard, a cover (not shown) may be placed over the nozzles 130 to prevent air from outside of the microfluidic refill cartridge 26 from entering the fluid path. It is to be appreciated that in some embodiments, the outer sleeve 85 of the fluid transport member 80 may prevent de-priming of the fluid transport member 80. That is, the sleeve 85 prevents air from entering the fluid transport member 80 along its radial surface.

Once primed, during use, when fluid exits the nozzle 130, fluid from the reservoir 50 is pulled up through the fluid path by capillary action. In that regard, as fluid exits the chamber 128, fluid automatically refills the chamber 128 by being pulled through the fluid path by capillary action.

As indicated above, the transport cover 86 in combination with the second end 84 of the fluid transport member 80 form a seal that fluidly isolates the chamber 88 from the reservoir 50 to assist in keeping the microfluidic refill cartridge 26 primed. It is to be appreciated that the chamber 88 may be at a different pressure than the reservoir 50.

It is to be appreciated that in many embodiments, the fluid transport member 80 is configured to self-prime. That is, fluid may travel from the first end 82 of the fluid transport member 80 to the second end 84 without the aid of a vacuum force or air pressure as discussed above.

The microfluidic refill cartridge 26 includes a vent path that places the reservoir in fluid communication with the external environment of the microfluidic refill cartridge 26. The vent path equalizes the air pressure in the reservoir 50 with the air pressure of the external environment. That is, as fluid exits the microfluidic refill cartridge 26 through the nozzles 130, air from the external environment fills the space in the reservoir 50 that is made by the removed fluid. In that regard, the air pressure above the fluid in the reservoir remains at atmosphere. This allows the microfluidic refill cartridge to remain primed and prevents or at least reduces back pressure in the fluid path. That is, by equalizing the pressure in the reservoir, the reservoir does not create a vacuum that pulls the fluid from the fluid path back into the reservoir.

Upon depletion of the fluid in the reservoir 50, the microfluidic refill cartridge 26 may be removed from the housing 10 and replaced with another microfluidic refill cartridge 26.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   securing a plurality of filters to a first surface of a printed circuit board strip, the plurality of filters covering a plurality of through holes, respectively, in the printed circuit board; and
   securing a plurality of semiconductor dice to a second, opposite surface of the printed circuit board strip, the plurality of semiconductor dice covering the plurality of through holes, respectively, the plurality of semiconductor dice including an inlet path in fluid communication with the plurality of through holes, respectively, and having nozzles for expelling a fluid.

2. The method of claim 1, further comprising forming the plurality of through holes in the printed circuit board strip prior to securing the plurality of filters to the first surface of the printed circuit board strip.

3. The method of claim 1, wherein securing the plurality of filters comprises:
   attaching the filters to the first surface of a printed circuit board strip using adhesive material; and
   exposing the adhesive material to heat or ultraviolet radiation to set the adhesive material.

4. The method of claim 1, further comprising forming a plurality of liners on sidewalls delimiting the through holes, respectively, in the printed circuit board.

5. The method of claim 4, wherein the plurality of liners are made from a metal material.

6. The method of claim 1, further comprising placing mechanical spacers between the filters and the first surface of the printed circuit board strip.

7. The method of claim 6, wherein placing the mechanical spacers comprises forming a solder mask layer on the printed circuit board strip, the solder mask layer including a raised portion around each through hole for forming the mechanical spacers.

8. The method of claim 1, further comprising separating the printed circuit board strip into a plurality of microfluidic delivery members.

9. The method of claim 1, wherein securing the plurality of semiconductor dice to the second, opposite surface of the printed circuit board strip includes using a screen printing technique to dispense the adhesive material on the second, opposite surface of the printed circuit board strip and placing the semiconductor dice in contact with the adhesive material.

10. A method comprising:
    coupling a filter to a first surface of a printed circuit board so that the filter is located over a through hole in the printed circuit board; and
    coupling a semiconductor die to the filter, the semiconductor die including an inlet path, wherein upon coupling the filter to the first surface of the printed circuit board and coupling the semiconductor die to the filter, the inlet path of the semiconductor die is located over the through hole in the printed circuit board.

11. The method of claim 10, wherein the step of coupling the semiconductor die to the filter occurs before the step of coupling the filter to the first surface of the printed circuit board.

12. The method of claim 10, wherein coupling the filter comprises using adhesive material to couple the filter to the first surface of the printed circuit board.

13. The method of claim 12, wherein coupling the filter to the first surface of the printed circuit board comprises applying adhesive to at least one of the filter and the first surface of the printed circuit board and placing the filter in contact with the first surface of the printed circuit board.

14. The method of claim 12, wherein the adhesive material also functions as a first mechanical spacer that places the filter a distance from the first surface of the printed circuit board.

15. The method of claim 10, further comprising providing a liner on sidewalls delimiting the through hole of the printed circuit board.

16. The method of claim 15, wherein providing the liner comprises depositing a metal material on the sidewalls delimiting the through hole.

17. The method of claim 15, wherein providing the liner comprises forming a liner from a molding material and securing the liner to the sidewalls delimiting the through hole.

18. A microfluidic delivery member comprising:
    a printed circuit board having first and second surfaces, the printed circuit board including a through hole that extends from the first surface to the second surface;
    a liner in the through hole; and
    a semiconductor die having first and second surfaces and an inlet path, the semiconductor die secured to the first surface of the printed circuit board with the inlet path in fluidic communication with the through hole of the printed circuit board, the second surface of the die including a plurality of nozzles that are in fluid communication with the inlet path, the plurality of nozzles being configured to expel a fluid received through the through hole of the printed circuit board.

19. The microfluidic delivery member of claim 18, wherein the liner is a polymer material or a metal material that covers sidewalls of the printed circuit board formed by the through hole.

20. The microfluidic delivery member of claim 18, further comprising a filter between the semiconductor die and the first surface of the printed circuit board, wherein the filter secures the semiconductor die to the first surface of the printed circuit board.

21. The microfluidic delivery member of claim 18, further comprising a filter, wherein the liner secures the filter to the second surface of the printed circuit board and covers the through hole.

22. The microfluidic delivery member of claim 18, wherein the liner has a first portion that extends onto the first surface of the printed circuit board and second portion that extends onto the second surface of the printed circuit board.

* * * * *